(12) United States Patent  (10) Patent No.: US 8,847,277 B2
Rahimo et al.  (45) Date of Patent: Sep. 30, 2014

(54) REVERSE-CONDUCTING POWER SEMICONDUCTOR DEVICE

(71) Applicant: ABB Technology AG, Zürich (CH)

(72) Inventors: Munaf Rahimo, Uezwil (CH); Martin Arnold, Baden (CH); Thomas Stiasny, Wädenswil (CH)

(73) Assignee: ABB Technology AG, Zurich (CH)

( * ) Notice: Subject to any disclaimer, the term of this patent is extended or adjusted under 35 U.S.C. 154(b) by 0 days.

(21) Appl. No.: 13/852,366

(22) Filed: Mar. 28, 2013

(65) Prior Publication Data

US 2013/0207157 A1  Aug. 15, 2013

Related U.S. Application Data

(63) Continuation of application No. PCT/EP2011/066979, filed on Sep. 29, 2011.

(30) Foreign Application Priority Data

Sep. 29, 2010 (EP) .................................. 10181546

(51) Int. Cl.
H01L 29/66 (2006.01)
H01L 21/332 (2006.01)

(52) U.S. Cl.
USPC .......................................... 257/152; 438/134

(58) Field of Classification Search
USPC ........... 257/110, 121, 144, 152; 438/133–136
See application file for complete search history.

(56) References Cited

U.S. PATENT DOCUMENTS

| 3,947,864 A | 3/1976 | Yatsuo et al. |
| 4,742,382 A | 5/1988 | Jaecklin |
| 5,587,594 A | 12/1996 | Jaecklin et al. |
| 5,594,261 A * | 1/1997 | Temple ......................... 257/140 |

FOREIGN PATENT DOCUMENTS

| EP | 0 200 863 A1 | 12/1986 |
| EP | 0 676 812 A2 | 10/1995 |

OTHER PUBLICATIONS

International Search Report (PCT/ISA/210) issued on Jun. 19, 2012, by the European Patent Office as the International Searching Authority for International Application No. PCT/EP2011/066979.
Euroean Search Report issued on Aug. 30, 2011.

(Continued)

*Primary Examiner* — Calvin Lee

(74) *Attorney, Agent, or Firm* — Buchanan Ingersoll & Rooney PC

(57) ABSTRACT

An exemplary reverse-conducting power semiconductor device with a wafer having a first main side and a second main side parallel to the first main side. The device includes a plurality of diode cells and a plurality of IGCT cells, each IGCT cell including between the first and second main side: a first anode electrode, a first anode layer of a first conductivity type on the first anode electrode, a buffer layer of a second conductivity type on the first anode layer, a drift layer of the second conductivity type on the buffer layer, a base layer of the first conductivity type on the drift layer, a first cathode layer of a second conductivity type on the base layer, and a cathode electrode on the first cathode layer. A mixed part includes the second anode layers of the diode cells alternating with the first cathode layers of the IGCT cells.

26 Claims, 3 Drawing Sheets

(56) References Cited

OTHER PUBLICATIONS

Hisao Oka et al., "Electrical Characteristics of High-Voltage High-Power Fast-Switching Reverse-Conducting Thysistor and Its Applications for Chopper Use", IEEE Transactions on Industry Applications, vol. IA-9, No. 2, Mar./Apr. 1973, pp. 236-247, XP-001295086.

Wang Cailin et al., "A New Isolation Technology With $p^4$ Diffusion Ring Used in Reverse Conducting GCT", Industrial Technology, Dec. 14-17, 2005, pp. 631-634, XP-010897762.

B. Jayant Baliga, "Power Thyristors", Power Semiconductor Devices, Dec. 31, 1995, pp. 287-291, XP-002656881.

* cited by examiner

REVERSE-CONDUCTING POWER SEMICONDUCTOR DEVICE

RELATED APPLICATION(S)

This application is a continuation under 35 U.S.C. §120 of International application PCT/EP2011/066979 filed Sep. 29, 2011, designating the U.S. and claiming priority to European application EP 10181546.2 filed Sep. 29, 2010. The content of each prior application is hereby incorporated by reference in its entirety.

FIELD

The disclosure relates to the field of power semiconductor devices, and particularly to a reverse conducting power semiconductor device.

BACKGROUND INFORMATION

As shown in FIG. 1, the RC-IGCT 100 includes within one wafer 10 an integrated gate commutated thyristor (IGCT) part 9 with IGCT cells 91 and a single built-in free-wheeling diode 97.

FIG. 2 shows a cut through an RC-IGCT according to a known implementation. The reverse-conducting semiconductor device 100 also includes a wafer 10 with layers of different conductivity types between a first main side 11, which is the cathode side of the integrated IGCT, and a second main side 15, which is the collector side of the IGCT cells 91 and which lies opposite the emitter side 11 (FIG. 2). The device includes IGCT cells 91, each of which with the following layers from the first main side 11 to the second main side 15: a cathode electrode 2 in form of a cathode metallization layer, a first (n+)-doped cathode layer 4, a (p)-doped base layer 6, an (n−)-doped drift layer 3, an (n)-doped buffer layer 8, a (p+)-doped first anode layer 5 and a first anode electrode 25 in form of an anode metallization layer. The plurality of IGCT cells 91 form the IGCT part 9 of the reverse conducting semiconductor device 100.

The IGCT cells 91 include a gate electrode 7, by which they are controlled. It is arranged as a gate metallization layer on the first main side 11. The gate electrode 7 is arranged lateral to, but separated from the cathode electrode 2 and the first cathode layer 4 and contacts the p-doped base layer 6. In the context of the present disclosure, "lateral" in describing layers means that two layers are arranged lateral to each other in view of a plane parallel to the first main side 11.

For reverse-conducting semiconductor devices 100 as shown in FIG. 1 a single freewheeling diode 97 is integrated on the same wafer 10. This single diode 97 is arranged lateral to the IGCT part 9 and includes on the first main side 11 a second (p)-doped anode layer 55 and in orthogonal projection to the area of the second anode layer 55 a second (n+)-doped cathode layer 45 on the second main side 15.

A plurality of the IGCT cells 91 can be arranged as stripes radially on a circular wafer 10. Stripes shall be understood as layers, which have in one direction a longer extension than in the other directions by having two longer sides, which can be arranged parallel to each other. Between the radially arranged IGCT cells 91 are the gate electrodes 7 arranged. The diode can be arranged as a single diode 97 either in the central part of the circular wafer or at the circumference of the wafer. If the single diode 97 is arranged in the central part, the IGCT part 9 is arranged on the circumference, the single diode 97 and IGCT part 9 being separated by a gate contact 75, to which the gate electrodes 7 are in electrical contact. For the single diode 97 being arranged at the circumference of the wafer 10, the IGCT part 9 is arranged in the central part and separated from the single diode 97 by the gate contact 75 or the IGCT part 9 is arranged adjacent to the diode 97 and the gate contact 75 is arranged in the central part.

In any case, the single diode 97 can be completely separated from the IGCT part 9 with no interaction between each other. That means if heat is created during operation of the device the heat is either generated in the single diode 97, if the device works in diode mode, or in the IGCT part 9, if the device is operated in IGCT mode. This might lead to overheating problems. Additionally, as the single diode 97 and IGCT part 9 are either strictly dedicated for diode or IGCT mode, this results in a large device.

EP 0 676 812 A describes a MOS controlled thyristor (MCT). Such devices can be operated only at much lower switching frequencies than GCTs and also the switched power is much lower. Such MCTs have an insulated gate and one common continuous p layer, which functions as anode layer for the diode cells as well as base layer in the MCT cells. A plurality of thyristor cells (forming a pilot MCT cell) is separated from another such plurality of thyristor cells by diode cells, which surround each set. The diode cells are of a sufficient width that no carriers can flow through a diode cell. If a set of thyristor cells is inoperable due to defects, these cells are not activated, so that the device can still be operated.

However, the MCT is turned off with a voltage pulse (MOS channel control) and not with a current pulse as for the GCT. Also the current is drawn out during turn-off from the gate in the GCT, whereas for the MCT it is forced to turn-off while the current drops through the main cathode by providing a MOS path. Hence for an MCT it can be easy to provide a diode area since its introduction is not affected by the gate control. As a result, such MCT devices face different technical specifications and are used for different applications than GCT devices.

SUMMARY

An exemplary reverse-conducting power semiconductor device with a wafer having a first main side and a second main side arranged parallel to the first main side is disclosed, the device comprising: a plurality of diode cells and a plurality of IGCT cells, wherein each IGCT cell includes layers in an order between the first and second main side as follows: a cathode electrode, a first cathode layer of the first conductivity type, a base layer of the second conductivity type, a drift layer of the first conductivity type, a buffer layer of the first conductivity type, a first anode layer of the second conductivity type, a first anode electrode, wherein each IGCT cell includes a gate electrode, which is arranged lateral to the first cathode layer and separated from the first cathode layer by the base layer, and wherein each diode cell includes a second anode electrode on the first main side, a second anode layer of the second conductivity type, which is separated from the base layer by the drift layer, and a second cathode layer of the first conductivity type, which is arranged alternating to the first anode layer on the second main side, and at least one mixed part in which the second anode layers of the diode cells alternate with the first cathode layers of the IGCT cells.

An exemplary reverse-conducting power semiconductor device with a wafer having a first main side and a second main side arranged parallel to the first main side is disclosed, the device comprising: a plurality of diode cells and a plurality of IGCT cells, wherein each IGCT cell includes between the first and second main side: a first anode electrode, a first anode layer of a first conductivity type formed on the first anode electrode, a buffer layer of a second conductivity type formed on the first anode layer, a drift layer of the second conductivity type formed on the buffer layer, a base layer of the first conductivity type formed on the drift layer; a first cathode layer of a second conductivity type formed on the base layer, and a cathode electrode formed on the first cathode layer, wherein each IGCT cell includes a gate electrode, which is arranged lateral to the first cathode layer and separated from the first cathode layer by the base layer, and wherein each diode cell includes a second anode electrode on the first main side, a second anode layer of the first conductivity type, which is separated from the base layer by the drift layer, and a second cathode layer of the second conductivity type, which is arranged alternating to the first anode layer on the second main side, and at least one mixed part in which the second anode layers of the diode cells alternate with the first cathode layers of the IGCT cells.

An exemplary reverse-conducting power semiconductor device with a wafer having a first main side and a second main side arranged parallel to the first main side is disclosed, the device comprising: a plurality of diode cells and a plurality of IGCT cells, wherein each IGCT cell includes layers in an order between the first and second main side as follows: a cathode electrode; a first cathode layer of a first conductivity type; a base layer of a second conductivity type; a drift layer of the first conductivity type; a buffer layer of the first conductivity type; a first anode layer of the second conductivity type; a first anode electrode, wherein each IGCT cell includes a gate electrode, which is arranged lateral to the first cathode layer and separated from the first cathode layer by the base layer, and wherein each diode cell includes a second anode electrode on the first main side, a second anode layer of the second conductivity type, which is separated from the base layer by the drift layer, and a second cathode layer of the first conductivity type, which is arranged alternating to the first anode layer on the second main side; at least one mixed part in which the second anode layers of the diode cells alternate with the first cathode layers of the IGCT cells, wherein the at least one mixed part of each diode cell is arranged such that one second anode layer is arranged between two of at least one of first cathode layers and gate electrodes; and at least one pilot IGCT part having a plurality of first cathode layers and gate electrodes, which are arranged directly adjacent to each other without having a second anode layer in between.

An exemplary reverse-conducting power semiconductor device with a wafer having a first main side and a second main side arranged parallel to the first main side is disclosed, the device comprising: a plurality of diode cells and a plurality of IGCT cells, wherein each IGCT cell includes layers in an order between the first and second main side as follows: a cathode electrode, a first cathode layer of a first conductivity type, a base layer of a second conductivity type, a drift layer of the first conductivity type, a buffer layer of the first conductivity type, a first anode layer of the second conductivity type, a first anode electrode, wherein each IGCT cell includes a gate electrode, which is arranged lateral to the first cathode layer and separated from the first cathode layer by the base layer, and wherein each diode cell includes a second anode electrode on the first main side, a second anode layer of the second conductivity type, which is separated from the base layer by the drift layer, and a second cathode layer of the first conductivity type, which is arranged alternating to the first anode layer on the second main side, and at least one mixed part in which the second anode layers of the diode cells alternate with the first cathode layers of the IGCT cells, wherein the at least one mixed part of each diode cell is arranged such that one second anode layer is arranged between two of at least one of first cathode layers and gate electrodes, and wherein the second cathode layers are arranged in an orthogonal projection to a second anode layer in an area that is limited at most by an orthogonal projection area of the first cathode layer of the directly adjacent IGCT cells.

An exemplary reverse-conducting power semiconductor device with a wafer having a first main side and a second main side arranged parallel to the first main side is disclosed, the device comprising: a plurality of diode cells and a plurality of IGCT cells, wherein each IGCT cell includes layers in an order between the first and second main side as follows: a cathode electrode, a first cathode layer of a first conductivity type, a base layer of a second conductivity type, a drift layer of the first conductivity type, a buffer layer of the first conductivity type, a first anode layer of the second conductivity type, a first anode electrode, wherein each IGCT cell includes a gate electrode, which is arranged lateral to the first cathode layer and separated from the first cathode layer by the base layer, and wherein each diode cell includes a second anode electrode on the first main side, a second anode layer of the second conductivity type, which is separated from the base layer by the drift layer, and a second cathode layer of the first conductivity type, which is arranged alternating to the first anode layer on the second main side, and at least one mixed part in which the second anode layers of the diode cells alternate with the first cathode layers of the IGCT cells, wherein the mixed part of each diode cell is arranged such that one second anode layer is arranged between two of at least one of first cathode layers and gate electrodes, wherein the second cathode layers are arranged in an orthogonal projection to a second anode layer in an area that is limited at most by an orthogonal projection area of the first cathode layer of the directly adjacent IGCT cells, and wherein the orthogonal projection area is a half part of the first cathode layer of the directly adjacent IGCT cells, which is arranged towards said second cathode layer.

An exemplary reverse-conducting power semiconductor device with a wafer having a first main side and a second main side arranged parallel to the first main side is disclosed, the device comprising: a plurality of diode cells and a plurality of IGCT cells, wherein each IGCT cell includes layers in an order between the first and second main side as follows: a cathode electrode, a first cathode layer of a first conductivity type, a base layer of a second conductivity type, a drift layer of the first conductivity type, a buffer layer of the first conductivity type, a first anode layer of the second conductivity type, a first anode electrode, wherein each IGCT cell includes a gate electrode, which is arranged lateral to the first cathode layer and separated from the first cathode layer by the base layer, and wherein each diode cell includes a second anode electrode on the first main side, a second anode layer of the second conductivity type, which is separated from the base layer by the drift layer, and a second cathode layer of the first conductivity type, which is arranged alternating to the first anode layer on the second main side, at least one mixed part in which the second anode layers of the diode cells alternate with the first cathode layers of the IGCT cells; and at least one pilot IGCT part having a plurality of first cathode layers and gate electrodes, which are arranged directly adjacent to each other without having a second anode layer in between, wherein the second cathode layers are arranged in an orthogonal projection to a second anode layer in an area that is limited at most by an orthogonal projection area of the first cathode layer of the directly adjacent IGCT cells.

An exemplary reverse-conducting power semiconductor device with a wafer having a first main side and a second main side arranged parallel to the first main side is disclosed, the device comprising: a plurality of diode cells and a plurality of IGCT cells, wherein each IGCT cell includes layers in an order between the first and second main side as follows: a cathode electrode, a first cathode layer of a first conductivity type, a base layer of a second conductivity type, a drift layer of the first conductivity type, a buffer layer of the first conductivity type, a first anode layer of the second conductivity type, a first anode electrode, wherein each IGCT cell includes a gate electrode, which is arranged lateral to the first cathode layer and separated from the first cathode layer by the base layer, and wherein each diode cell includes a second anode electrode on the first main side, a second anode layer of the second conductivity type, which is separated from the base layer by the drift layer, and a second cathode layer of the first conductivity type, which is arranged alternating to the first anode layer on the second main side, at least one mixed part in which the second anode layers of the diode cells alternate with the first cathode layers of the IGCT cells; and at least one pilot IGCT part having a plurality of first cathode layers and gate electrodes, which are arranged directly adjacent to each other without having a second anode layer in between, wherein the second cathode layers are arranged in an orthogonal projection to a second anode layer in an area that is limited at most by an orthogonal projection area of the first cathode layer of the directly adjacent IGCT cells, and wherein the orthogonal projection area is a half part of the first cathode layer of the directly adjacent IGCT cells, which is arranged towards said second cathode layer.

BRIEF DESCRIPTION OF THE DRAWINGS

The subject matter of the disclosure will be explained in more detail in the following text with reference to the attached drawings, in which.

DETAILED DESCRIPTION

Figure 1:
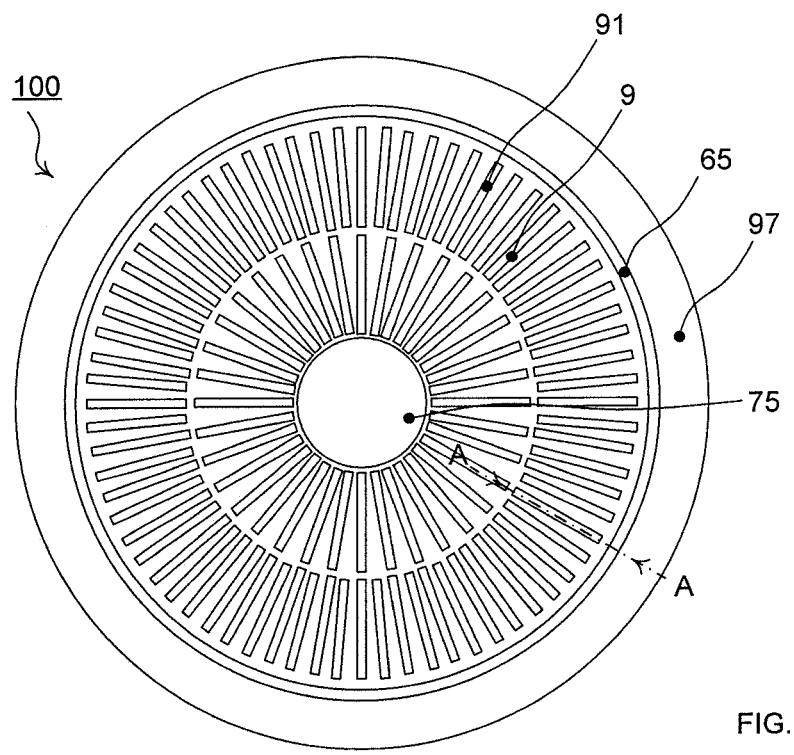
FIG. 1 shows a top view on an RC-IGCT according to a known implementation.
Figure 2:
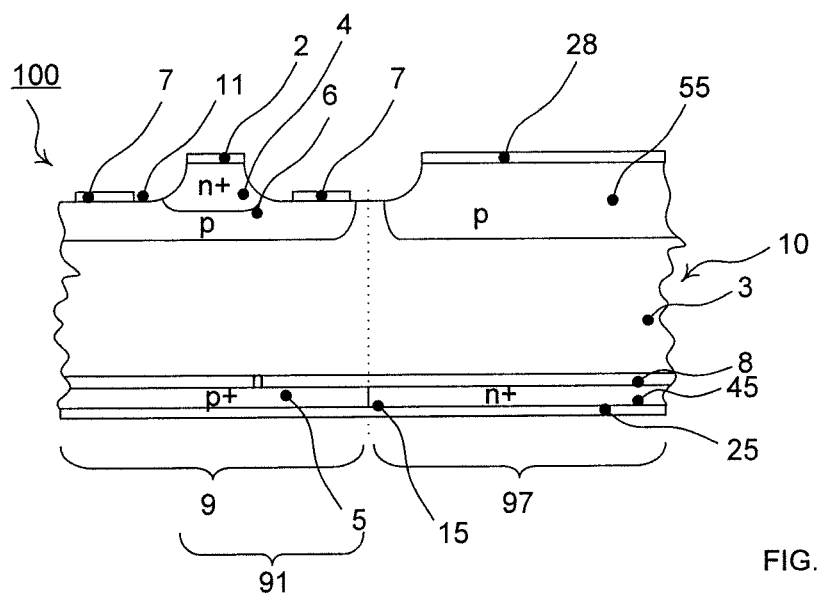
FIG. 2 shows a cut through an RC-IGCT according to a known implementation.

Exemplary embodiments of the present disclosure provide a reverse conducting power semiconductor device with improved performance of the device in view of thermal and electrical properties and reduced size.

An exemplary reverse conducting power semiconductor device disclosed herein can include a wafer having a first main side and a second main side, which is arranged parallel to the first main side. The device can also include a plurality of diode cells and a plurality of IGCT cells (integrated gate commutated thyristor cells), wherein each IGCT cell has (e.g., comprises) layers in the following order between the first and second main side a cathode electrode, a first cathode layer of the first conductivity type, a base layer of the second conductivity type, a drift layer of the first conductivity type, a buffer layer of the first conductivity type, a first anode layer of the second conductivity type, and a first anode electrode.

Each IGCT cell further includes a gate electrode, which is arranged lateral to the first cathode layer and separated from it by the base layer. Such GCT cells are well-known to the experts. They are similar to GTO cells in their construction, from which they are a further development, but differ from them in the gate control and switching on and off. With respect to the positioning of an IGCT cell it shall be understood as the positioning of the first cathode layer 4 (and gate electrode 7 and base layer 6), e.g., the positioning of the first main sided layers of the IGCT cell.

Each diode cell includes a second anode electrode on the first main side, which is in contact to a second anode layer of the second conductivity type, which second anode layer is separated from the base layer by the drift layer, and a second cathode layer of the first conductivity type on the second main side, which is arranged alternating to the first anode layer. In the context of the present disclosure, the positioning of a diode cell shall be understood as the positioning of the second anode layer, e.g., the positioning of the first main sided layers of the diode cell.

The device includes at least one mixed part, in which diode cells (e.g., the second anode layers of the diode cells) alternate with IGCT cells (e.g., the first cathode layers (and gate electrode 7 and base layer 6) of the IGCT cells).

Due to the alternating arrangement of the IGCT cells and diode cells, a bipolar junction transistor (BJT) is formed between the second anode layer of the diode cell and the first anode layer of the IGCT cell. In IGCT turn-off mode, the safe operating area (SOA) performance is improved due to this integrated BJT. Besides, the gate power during turn-off is reduced due to the BJT, which will carry a certain amount of turn-off current through the cathode terminal of the BJT, e.g., the diode anode electrode.

The first anode layer of the IGCT cell is shorted by the second cathode layer of the diode cell. By these shorts, the device shows a softer performance than known devices, which heavily suffer from snappy reverse recovery.

The inventive reverse conducting power semiconductor device has a better thermal resistance, because due to the distributed diode and IGCT cells the heat is distributed over a greater area. In case of the device working in IGCT mode exemplarily, due to the distributed cells, the heat can easily spread also into the diode cells and therefore, the temperature within the device is lower than for a known device, in which the single diode is concentrated to one continuous area so that the heat spreads much less efficient into the diode area.

Also the current handling capability is better than the known devices due to the at least part or full integration of the diode and IGCT structures for allowing part or full utilization of the wafer area (exemplarily made of silicon) in IGCT mode and sufficient utilization of the wafer area in the diode mode of operation. The above effect is reached due to the close proximity of the IGCT and diode cells, e.g., the alternating arrangement of IGCT and diode cells, which would allow the charge plasma during conduction for the IGCTs to spread laterally into or through the adjacent diode cells. Depending on the size of the diode cells the holes enter the diode cells (holes flow into the second anode layer) and can even pass through them.

The reference symbols used in the figures and their meaning are summarized in the list of reference symbols. Alike or alike-functioning parts can be given the same reference symbols. The described exemplary embodiments are meant as examples and shall not confine the disclosure.

Figure 3:
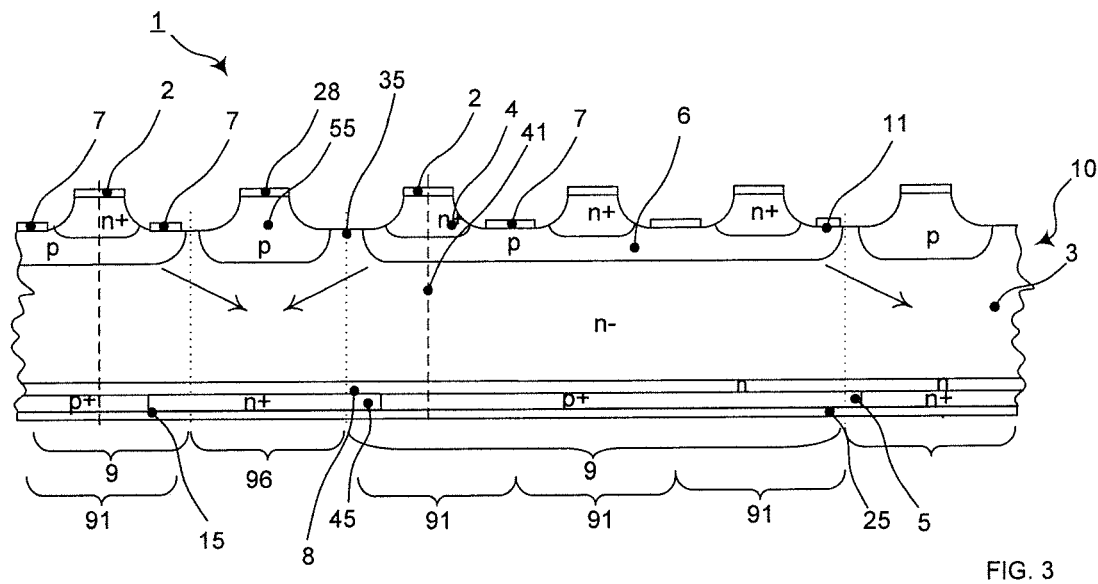
FIG. 3 shows a cut through a first RC-IGCT in accordance with an exemplary embodiment of the present disclosure.

FIG. 3 shows a cut through a first RC-IGCT in accordance with an exemplary embodiment of the present disclosure. FIG. 3 shows an inventive semiconductor device in form of a reverse conducting power semiconductor device 1 with a wafer 10 having a first main side 11 and a second main side 15, which is arranged parallel to the first main side 11. The device includes a plurality of diode cells 96 and a plurality of IGCT cells 91, wherein each IGCT cell 91 includes layers in the following order between the first and second main side 11, 15, a cathode electrode 2, an n+ doped first cathode layer 4, a p doped base layer 6, an (n−) doped drift layer 3, an n doped buffer layer 8, a p+ doped first anode layer 5, and a first anode electrode 25.

Each IGCT cell 91 further includes a gate electrode 7, which is arranged lateral to the first cathode layer 4 and separated from it by the base layer 6. In an exemplary embodiment the buffer layer 8 has a maximum doping concentration of at most 101 b cm-3. The first main sided layers of an IGCT cell (e.g., first cathode layer 4, base layer 6 together with gate electrode 7) can be aligned to the second main sided layers of said IGCT cell (e.g., first anode layer 5). In case of non-alignment that first anode layer 5, which is arranged closest to the first main sided layers shall belong to the same cell. Therefore, in case of non-alignment the device can be designed in such a way that more than one second sided layer can be allocated to a cell or in which one second sided layer is allocated to two cells.

Each diode cell 96 includes a second anode electrode 28, a p-doped second anode layer 55 on the first main side 11, which is separated from the base layer 6 by the drift layer 3, and an (n+) doped second cathode layer 45 on the second main side 15, which is arranged alternating to the first anode layer 5. The second anode layer 55 contacts the second anode electrode 28. The first anode electrode 25 of the IGCT cells functions as a cathode electrode for the diode cells 96. The first main sided layers of a diode cell (e.g., second anode layer 55) can be aligned to the second main sided layers of said diode cell (e.g., second cathode layer 45). In case of non-alignment that second cathode layer 45, which is arranged closest to the first main sided layers shall belong to the same cell. Therefore, in case of non-alignment the device can be designed in such a way that more than one second sided layer can be allocated to a cell or in which one second sided layer is allocated to two cells.

The diode cell 96 can be separated from the IGCT cell 91 by a separation region 35, which is formed by that part of the drift layer 3, which is arranged between the diode and IGCT cell 96, 91 and where the drift layer 3 extends to the first main side 11. The separation region 35 can also employ standard edge termination techniques for improved field spreading under reverse biasing conditions.

A lifetime killing layer can be arranged at least in the diode cells 96. This can be done by limiting the lifetime killing layer to the diode cells 96 using a mask during creation or applying a laterally limited ion beam onto the diode cells 96. In another exemplary embodiment, the lifetime killing layer can be formed as a continuous layer over the whole area of the wafer in one plane, the plane being arranged parallel to the main sides. Independently of whether the lifetime killing layer is limited to the diode cells or made as a continuous layer, the device can be irradiated with protons or Helium ions for the creation of the lifetime killing layer, followed by an anneal step.

In the context of the present disclosure, "Depth" shall mean the maximum distance to which a layer extends from the side, at which the layer is arranged, e.g., for the p base layer 6 it is the maximum distance from the first main side 11 and in orthogonal projection to the first main side 11. The first main side 11 shall be arranged in that plane, on which the gate electrodes 7 project from the wafer 10.

The device includes at least one mixed part 99, in which diode cells 96 alternate with IGCT cells 91. In an exemplary embodiment, the diode cells 96 can be arranged such that one diode cell is arranged between two neighbored IGCT cells 91. That means that each diode cell is 96 arranged such that one second anode layer 55 is arranged between two neighbored IGCT cells 91, e.g., between the first cathode layers (4) belonging to these IGCT cells 91 and/or their gate electrodes 7.

In another exemplary embodiment, there can be a plurality of IGCT cells arranged directly neighbored to each other such that the ratio of the diode cells 91 to IGCT cells 96 varies between 1:1 up to 1:5. The number of diode cells can be defined as the number of second anode layers and for the IGCT cells as the number of first cathode layers. Also for the mixed part the diode cell shall be understood as the arrangement of the second anode layers and the IGCT cells as the arrangement of first cathode layers.

In the context of exemplary embodiments of the present disclosure positioning of a diode cell 96 shall be understood as the positioning of the second anode layer 55, e.g., the positioning of the first main sided layers of the diode cell. With respect to the positioning of an IGCT cell it shall be understood as the positioning of the first cathode layer 4 (and gate electrode 7 and base layer 6), e.g., the positioning of the first main sided layers of the IGCT cell.

In exemplary embodiments disclosed herein, the layers on the second main side 15, e.g., first anode layer 5 and second cathode layer 45 can be aligned to the layers on the first main side such that for a diode cell 96 the second cathode layer 45 is arranged in orthogonal projection/opposite to the second anode layer 55. For an IGCT cell 91 the first cathode layer and the gate electrode 7 can be arranged in orthogonal projection to/opposite to the first anode layer 5. Alternatively, there is no alignment between the first main sided layers and the second main sided layers.

In this exemplary embodiment, there are at least as many IGCT cells 96 as there are diode cells 91. The ratio can for example be at least 1:3 in order to achieve a good IGCT performance. Even with such a ratio, there are still enough diode cells 96 to ensure good performance in diode mode. In another exemplary embodiment, the structures on the first main side are aligned to the structures of the second main side. That means that in a diode cell the second anode layer is arranged in projection/opposite to the second cathode layer. In the IGCT cells the first cathode layer and the gate electrode are arranged in orthogonal projection/opposite to the first anode layer.

The diode cells 96 can have such a small size that during operation of the device in the IGCT mode the plasma is formable in the diode cell 96. This effect can be achieved by at least one of or all of the diode cells 96 having a maximum lateral extension in a plane parallel to the first main side 11 of 50 up to 500 μm. In order to achieve this result, at least one of or all of the IGCT cells 91 can have a maximum lateral extension in a plane parallel to the first main side 11 of 50 up to 500 μm. In another exemplary embodiment, at least one or all of the IGCT and the diode cells have a maximum lateral extension in a plane parallel to the first main side 11 of 50 up to 500 μm. Lateral extension of a cell can be understood as the distance between two neighbored cells, e.g., the distance between a second anode layer 55 and one of the first main sided layers of a directly neighbored IGCT cell or between the first main sided layers of two directly neighbored IGCT cells.

In another exemplary embodiment, the second cathode layers 45 can be arranged in orthogonal projection to a second anode layer 55 in an area, which is limited at most by an orthogonal projection area of the first cathode layer 4 of the directly adjacent IGCT cells.

The first cathode layer 4 includes one first half part, which is arranged closer to a second cathode layer 45 than a second half part. The area, in which the second cathode layer 45 is arranged, can be further limited by the diode cell area and the orthogonal projection area of the first half part of the first cathode layers 4 of the directly adjacent IGCT cells 91. That means that the second cathode layers 45 are arranged in orthogonal projection to a second anode layer 55 an area, which is limited at most by an orthogonal projection area of that half part of the first cathode layer 4 of the directly adjacent IGCT cells 91, which is arranged towards said second cathode layer 45.

The doping concentration and depth of the base layer(s) 6 and the second anode layer(s) 55 can be chosen to be identical or independently from each other. For example, the doping concentration and/or the depth of the second anode layer(s) 55 can be chosen to be lower than that of the base layer(s) 6. In that case, there is less injection efficiency in the second anode layer 55 and therefore, less lifetime control can be called for than in a device with a deeper second anode layer 55.

The total area of the second cathode layers 45 in a plane parallel to the first main side 11 can be chosen to be 10 to 30% of the total wafer area.

Figure 4:
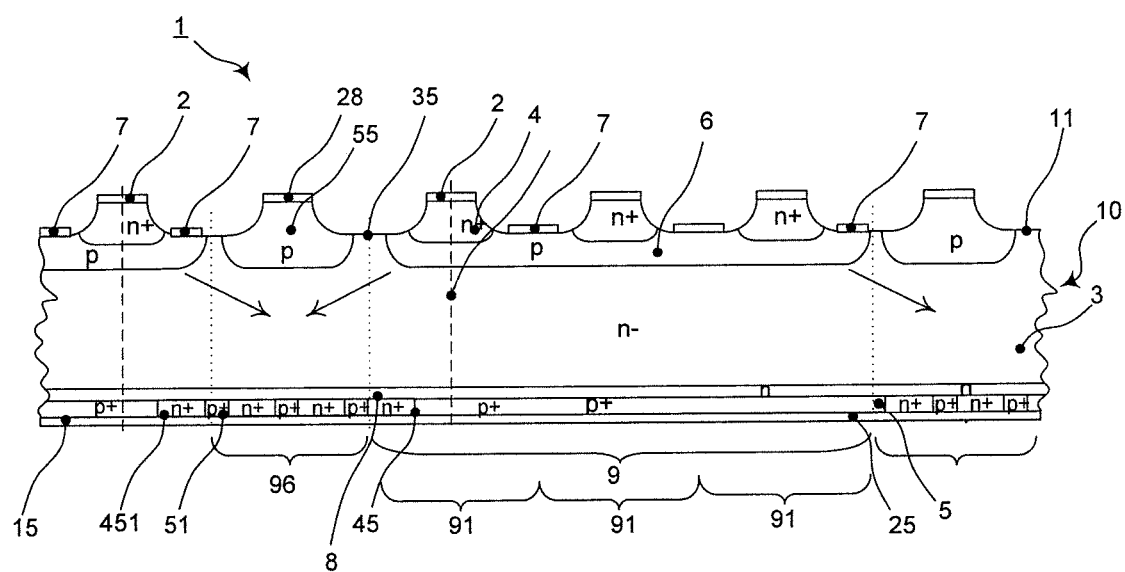
FIG. 4 shows a cut through a second RC-IGCT in accordance with an exemplary embodiment of the present disclosure.

FIG. 4 shows a cut through a second RC-IGCT in accordance with an exemplary embodiment of the present disclosure. As shown in FIG. 4, the second cathode layer 45 can be formed of distributed cathode regions 451 alternating with anode short regions 51 of the second conductivity type. The anode short regions 51 do not have to be aligned with the structure of the device on the first main side 11, e.g., the second cathode layers 45 as well as the first anode layers 5 and the anode short regions 51 do not have to be positioned in orthogonal projection to the second anode layer 55 or the first cathode layer 4, respectively.

To allow fast switching between IGCT to diode mode the diode cells 96 (e.g., second anode layers 55) can be distributed uniformly over the wafer area in the mixed part 99.

It can also be advantageous to have a pilot IGCT part 9 on the wafer 10, which consists of IGCT cells 91 (six or more, or at least 10 as desired), which are arranged directly adjacent to each other, and not having a diode cell in the pilot IGCT part 9. Such a pilot IGCT part 9 consists of the first main side 11 of first cathode layers 4 and gate electrodes 7 (together with the common, continuous base layer 6), which are arranged directly adjacent to each other without having a second anode layer 4 in between.

Such a pilot IGCT part can be a single IGCT part 9 or there can be a plurality, e.g., two or more such IGCT parts arranged in the device. The total area of the IGCT pilot parts 9 can be 10 to 50% of the total wafer area. With such a pilot IGCT part 9 the turn-on performance of the device can be improved.

Figure 5:
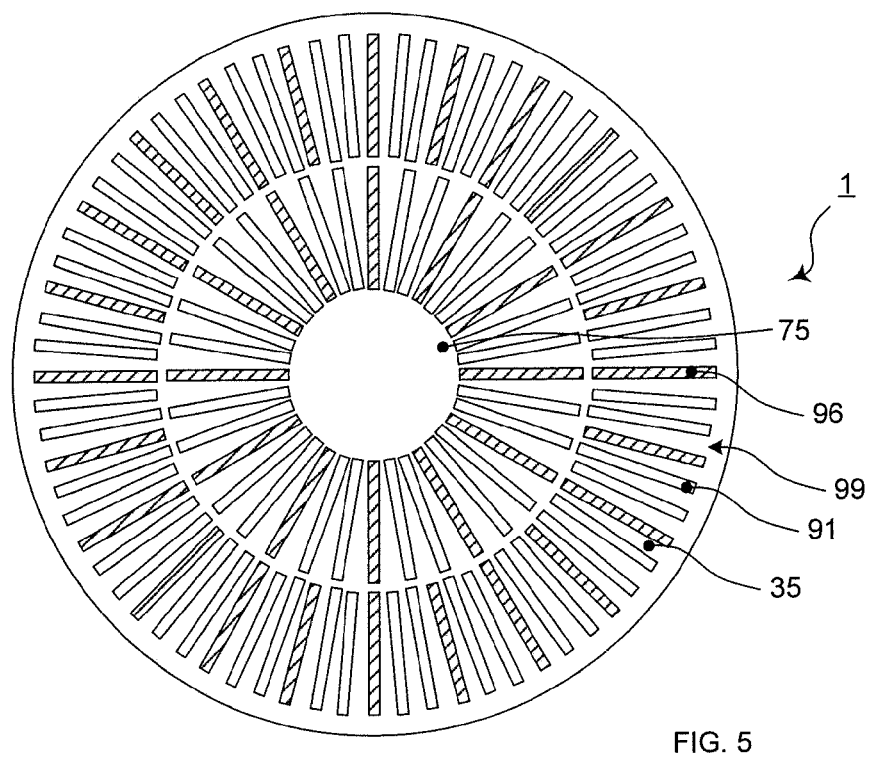
FIG. 5 shows a top view of the first RC-IGCT in accordance with an exemplary embodiment of the present disclosure.
Figure 6:
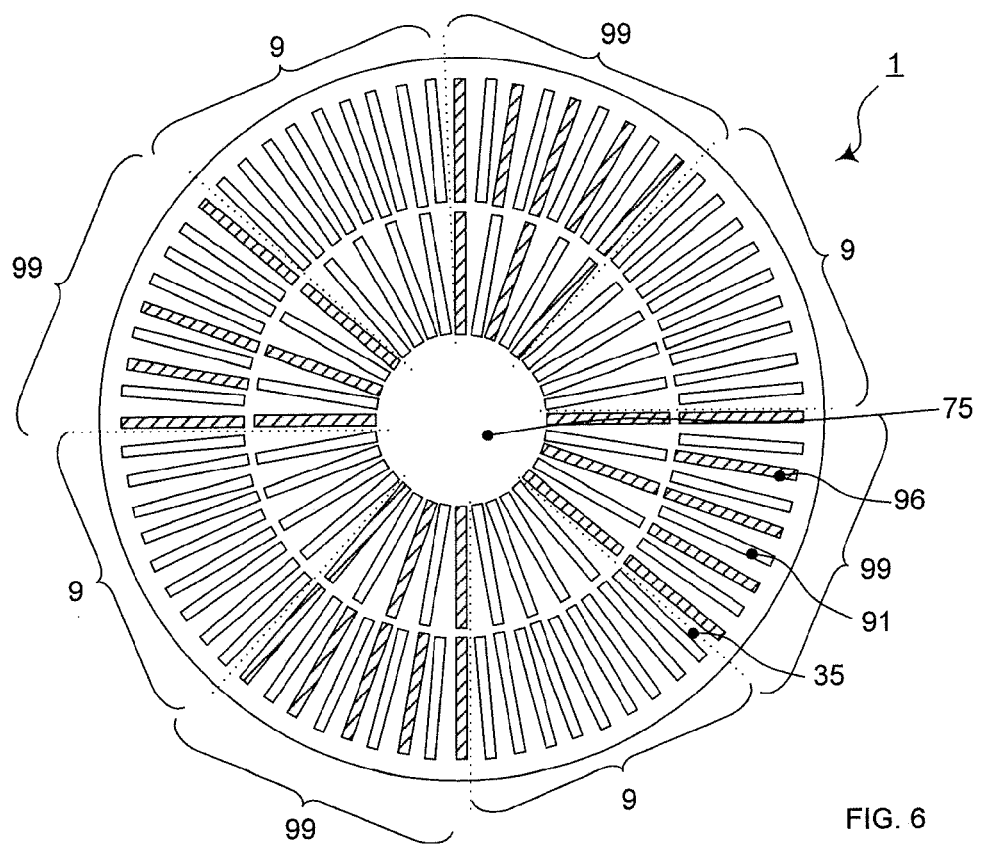
FIG. 6 shows a top view of the second RC-IGCT in accordance with an exemplary embodiment of the present disclosure.

In yet another exemplary embodiment, the wafer 10 has a shape of a circle and the first cathode layers 4 and the second anode layers 55 are arranged as stripes radially to a center of the circle. FIG. 5 shows a top view of the first RC-IGCT in accordance with an exemplary embodiment of the present disclosure. The diode cells 96 can be arranged in a regular manner around the center of the circle as shown in FIG. 5. In another exemplary embodiment, there are pilot IGCT parts 9, arranged in segments of the circle alternating with segments, in which IGCT cells 95 alternate with diode cells 91, thus forming an area 99 mixed with IGCT cells 91 with diode cells 96. That means that a plurality of first cathode layers 4, base layer 6 and gate electrodes 7 are arranged directly adjacent to each other without having a second anode layer 4 in between.

In another exemplary embodiment, the conductivity types are switched, e.g., all layers of the first conductivity type are p type (e.g. the drift layer 3) and all layers of the second conductivity type are n type (e.g. base layer 6).

The term "comprising" does not exclude other elements or steps and that the indefinite article "a" or "an" does not exclude the plural. Also elements described in association with different exemplary embodiments can be combined. It should also be noted that reference signs in the claims shall not be construed as limiting the scope of the claims.

These examples shall not limit the scope of the disclosure. The above mentioned designs and arrangements are just examples for any kinds of possible designs and arrangements for the base layer(s) and well (zones).

It will be appreciated by those skilled in the art that the present disclosure can be embodied in other specific forms without departing from the spirit or essential characteristics thereof. The presently disclosed embodiments are therefore considered in all respects to be illustrative and not restricted. The scope of the disclosure is indicated by the appended claims rather than the foregoing description and all changes that come within the meaning and range and equivalence thereof are intended to be embraced therein.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE LIST

1 Reverse conducting power semiconductor device
10 Wafer
11 First main side
15 Second main side
100 Known reverse conducting power semiconductor device
2 Cathode electrode
25 First anode electrode
28 Second anode electrode
3 Drift layer
35 Separation region
4 First cathode layer
41 half part
45 Second cathode layer
451 Distributed cathode region
5 First anode layer
51 Anode short region
55 Second anode layer
6 Base layer
7 Gate electrode
75 Gate contact
8 Buffer layer
9 pilot IGCT part
91 IGCT cell
96 diode cell
97 single diode
99 mixed IGCT/diode part

What is claimed is:

1. A reverse-conducting power semiconductor device with a wafer having a first main side and a second main side arranged parallel to the first main side, the device comprising:
   a plurality of diode cells and a plurality of IGCT cells, wherein each IGCT cell includes layers in an order between the first and second main side as follows:
   a cathode electrode,
   a first cathode layer of a first conductivity type,
   a base layer of a second conductivity type,
   a drift layer of the first conductivity type,
   a buffer layer of the first conductivity type,
   a first anode layer of the second conductivity type,
   a first anode electrode,
   wherein each IGCT cell includes a gate electrode, which is arranged lateral to the first cathode layer and separated from the first cathode layer by the base layer, and
   wherein each diode cell includes a second anode electrode on the first main side, a second anode layer of the second conductivity type, which is separated from the base layer by the drift layer, and a second cathode layer of the first conductivity type, which is arranged alternating to the first anode layer on the second main side, and
   at least one mixed part in which the second anode layers of the diode cells alternate with the first cathode layers of the IGCT cells.

2. The device according to claim 1, wherein the mixed part of each diode cell is arranged such that one second anode layer is arranged between two of at least one of first cathode layers and gate electrodes.

3. The device according to claim 1, wherein a ratio of diode cells to IGCT cells is between 1:1 up to 1:5, and wherein a number of diode cells is defined as the number of second anode layers and for the IGCT cells as the number of first cathode layers.

4. The device according to claim 1, comprising:
   at least one pilot IGCT part having a plurality of first cathode layers and gate electrodes, which are arranged directly adjacent to each other without having a second anode layer in between.

5. The device according to claim 3, wherein the at least one pilot IGCT part has a total area of 10 to 50% of the wafer area.

6. The device according to claim 1, wherein the second anode layers are distributed uniformly over the wafer area in the at least one mixed part.

7. The device according to claim 1, wherein at least one of the first main sided part of the diode cells to the first main sided part of the IGCT cells or between two neighbored first main sided parts of the IGCT cells have a maximum lateral distance of 50 to 500 μm to each other in a plane parallel to the first main side.

8. The device according to claim 1, wherein at least one of a doping concentration and a depth of the base layer and the second anode layer differ in a doping concentration and depth.

9. The device according to claim 8, wherein at least one of the doping concentration and the depth of the second anode layer is lower than at least one of the doping concentration and the depth of the base layer.

10. The device according to claim 1, wherein a total area of the second cathode layers in a plane parallel to the first main side is 10 to 30% of a wafer area.

11. The device according to claim 1, wherein the second cathode layers are arranged in an orthogonal projection to a second anode layer in an area that is limited at most by an orthogonal projection area of the first cathode layer of the directly adjacent IGCT cells.

12. The device according to claim 11, wherein the second cathode layers are arranged in orthogonal projection to a second anode layer in an area that is limited at most by an orthogonal projection area of a half part of the first cathode layer of the directly adjacent IGCT cells, which is arranged towards said second cathode layer.

13. The device according to claim 1, wherein each second cathode layer includes distributed cathode regions of the first conductivity type alternating with anode short regions of the second conductivity type.

14. The device according to claim 1, wherein a lifetime killing layer is arranged in the diode cells or as a continuous layer at least in one plane over the whole wafer.

15. The device according to claim 1, wherein the wafer has a shape of a circle such that the first cathode layers and the second anode layers are arranged as stripes radially to a center of the circle.

16. The device according to claim 15, comprising:
   at least one pilot IGCT part including:
      a plurality of first cathode layers;
      base layer and gate electrodes that are arranged directly adjacent to each other without having a second anode layer in between,
      wherein at least one segment of the circle is a pilot IGCT part.

17. A reverse-conducting power semiconductor device with a wafer having a first main side and a second main side arranged parallel to the first main side, the device comprising:
   at least one diode cell and at least one IGCT cell, wherein the at least one IGCT cell includes between the first and second main side:
   a first anode electrode,
   a first anode layer of a first conductivity type formed on the first anode electrode,
   a buffer layer of a second conductivity type formed on the first anode layer,
   a drift layer of the second conductivity type formed on the buffer layer,
   a base layer of the first conductivity type formed on the drift layer;
   a first cathode layer of a second conductivity type formed on the base layer, and
   a cathode electrode formed on the first cathode layer,
   wherein the at least one IGCT cell includes a gate electrode, which is arranged lateral to the first cathode layer and separated from the first cathode layer by the base layer, and
   wherein the at least one diode cell includes a second anode electrode on the first main side, a second anode layer of the first conductivity type, which is separated from the base layer by the drift layer, and a second cathode layer of the second conductivity type, which is arranged alternating to the first anode layer on the second main side, and
   at least one mixed part in which a second anode layer of the at least one diode cell is formed on the first cathode layer of the at least one IGCT cell.

18. The device according to claim 17, wherein the mixed part of each diode cell is arranged such that one second anode layer is arranged between two of at least one of first cathode layers and gate electrodes.

19. The device according to claim 17, wherein the second cathode layers are arranged in an orthogonal projection to a second anode layer in an area that is limited at most by an orthogonal projection area of the first cathode layer of the directly adjacent IGCT cells.

20. The device according to claim 19, wherein the second cathode layers are arranged in orthogonal projection to a second anode layer an area that is limited at most by an orthogonal projection area of a half part of the first cathode layer of the directly adjacent IGCT cells, which is arranged towards said second cathode layer.

21. The device according to claim 17, wherein each second cathode layer includes distributed cathode regions of the second conductivity type alternating with anode short regions of the first conductivity type.

22. A reverse-conducting power semiconductor device with a wafer having a first main side and a second main side arranged parallel to the first main side, the device comprising:
 a plurality of diode cells and a plurality of IGCT cells, wherein each IGCT cell includes layers in an order between the first and second main side as follows:
  a cathode electrode;
  a first cathode layer of a first conductivity type;
  a base layer of a second conductivity type;
  a drift layer of the first conductivity type;
  a buffer layer of the first conductivity type;
  a first anode layer of the second conductivity type;
  a first anode electrode,
  wherein each IGCT cell includes a gate electrode, which is arranged lateral to the first cathode layer and separated from the first cathode layer by the base layer, and
  wherein each diode cell includes a second anode electrode on the first main side, a second anode layer of the second conductivity type, which is separated from the base layer by the drift layer, and a second cathode layer of the first conductivity type, which is arranged alternating to the first anode layer on the second main side;
 at least one mixed part in which the second anode layers of the diode cells alternate with the first cathode layers of the IGCT cells, wherein the at least one mixed part of each diode cell is arranged such that one second anode layer is arranged between two of at least one of first cathode layers and gate electrodes; and
 at least one pilot IGCT part having a plurality of first cathode layers and gate electrodes, which are arranged directly adjacent to each other without having a second anode layer in between.

23. A reverse-conducting power semiconductor device with a wafer having a first main side and a second main side arranged parallel to the first main side, the device comprising:
 a plurality of diode cells and a plurality of IGCT cells, wherein each IGCT cell includes layers in an order between the first and second main side as follows:
  a cathode electrode,
  a first cathode layer of a first conductivity type,
  a base layer of a second conductivity type,
  a drift layer of the first conductivity type,
  a buffer layer of the first conductivity type,
  a first anode layer of the second conductivity type,
  a first anode electrode,
  wherein each IGCT cell includes a gate electrode, which is arranged lateral to the first cathode layer and separated from the first cathode layer by the base layer, and
  wherein each diode cell includes a second anode electrode on the first main side, a second anode layer of the second conductivity type, which is separated from the base layer by the drift layer, and a second cathode layer of the first conductivity type, which is arranged alternating to the first anode layer on the second main side, and
 at least one mixed part in which the second anode layers of the diode cells alternate with the first cathode layers of the IGCT cells,
 wherein the at least one mixed part of each diode cell is arranged such that one second anode layer is arranged between two of at least one of first cathode layers and gate electrodes, and
 wherein the second cathode layers are arranged in an orthogonal projection to a second anode layer in an area that is limited at most by an orthogonal projection area of the first cathode layer of the directly adjacent IGCT cells.

24. A reverse-conducting power semiconductor device with a wafer having a first main side and a second main side arranged parallel to the first main side, the device comprising:
 a plurality of diode cells and a plurality of IGCT cells, wherein each IGCT cell includes layers in an order between the first and second main side as follows:
  a cathode electrode,
  a first cathode layer of a first conductivity type,
  a base layer of a second conductivity type,
  a drift layer of the first conductivity type,
  a buffer layer of the first conductivity type,
  a first anode layer of the second conductivity type,
  a first anode electrode,
  wherein each IGCT cell includes a gate electrode, which is arranged lateral to the first cathode layer and separated from the first cathode layer by the base layer, and
  wherein each diode cell includes a second anode electrode on the first main side, a second anode layer of the second conductivity type, which is separated from the base layer by the drift layer, and a second cathode layer of the first conductivity type, which is arranged alternating to the first anode layer on the second main side, and
 at least one mixed part in which the second anode layers of the diode cells alternate with the first cathode layers of the IGCT cells,
 wherein the mixed part of each diode cell is arranged such that one second anode layer is arranged between two of at least one of first cathode layers and gate electrodes,
 wherein the second cathode layers are arranged in an orthogonal projection to a second anode layer in an area that is limited at most by an orthogonal projection area of the first cathode layer of the directly adjacent IGCT cells, and
 wherein the orthogonal projection area is a half part of the first cathode layer of the directly adjacent IGCT cells, which is arranged towards said second cathode layer.

25. A reverse-conducting power semiconductor device with a wafer having a first main side and a second main side arranged parallel to the first main side, the device comprising:
 a plurality of diode cells and a plurality of IGCT cells, wherein each IGCT cell includes layers in an order between the first and second main side as follows:
  a cathode electrode,
  a first cathode layer of a first conductivity type,
  a base layer of a second conductivity type,
  a drift layer of the first conductivity type,
  a buffer layer of the first conductivity type,
  a first anode layer of the second conductivity type,
  a first anode electrode, wherein each IGCT cell includes a gate electrode, which is arranged lateral to the first cathode layer and separated from the first cathode layer by the base layer, and wherein each diode cell includes a second anode electrode on the first main side, a second anode layer of the second conductivity type, which is separated from the base layer by the drift layer, and a second cathode layer of the first conductivity type, which is arranged alternating to the first anode layer on the second main side, at least one mixed part in which the second anode layers of the diode cells alternate with the first cathode layers of the IGCT cells; and at least one pilot IGCT part having a plurality of first cathode layers and gate electrodes, which are arranged directly adjacent to each other without having a second anode layer in between, wherein the second cathode layers are arranged in an orthogonal projection to a second anode layer in an area that is limited at most by an orthogonal projection area of the first cathode layer of the directly adjacent IGCT cells.

26. A reverse-conducting power semiconductor device with a wafer having a first main side and a second main side arranged parallel to the first main side, the device comprising:

a plurality of diode cells and a plurality of IGCT cells, wherein each IGCT cell includes layers in an order between the first and second main side as follows:
a cathode electrode,
a first cathode layer of a first conductivity type,
a base layer of a second conductivity type,
a drift layer of the first conductivity type,
a buffer layer of the first conductivity type,
a first anode layer of the second conductivity type,
a first anode electrode, wherein each IGCT cell includes a gate electrode, which is arranged lateral to the first cathode layer and separated from the first cathode layer by the base layer, and wherein each diode cell includes a second anode electrode on the first main side, a second anode layer of the second conductivity type, which is separated from the base layer by the drift layer, and a second cathode layer of the first conductivity type, which is arranged alternating to the first anode layer on the second main side, at least one mixed part in which the second anode layers of the diode cells alternate with the first cathode layers of the IGCT cells; and at least one pilot IGCT part having a plurality of first cathode layers and gate electrodes, which are arranged directly adjacent to each other without having a second anode layer in between, wherein the second cathode layers are arranged in an orthogonal projection to a second anode layer in an area that is limited at most by an orthogonal projection area of the first cathode layer of the directly adjacent IGCT cells, and wherein the orthogonal projection area is a half part of the first cathode layer of the directly adjacent IGCT cells, which is arranged towards said second cathode layer.

* * * * *